US011467232B2

(12) United States Patent
Muehlenhoff et al.

(10) Patent No.: US 11,467,232 B2
(45) Date of Patent: Oct. 11, 2022

(54) MAGNETORESISTIVE SENSOR AND FABRICATION METHOD FOR A MAGNETORESISTIVE SENSOR

(71) Applicant: Infineon Technologies AG, Neubiberg (DE)

(72) Inventors: Clemens Muehlenhoff, Munich (DE); Wolfgang Raberg, Sauerlach (DE); Dieter Suess, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 79 days.

(21) Appl. No.: 16/948,478

(22) Filed: Sep. 21, 2020

(65) Prior Publication Data
US 2021/0096195 A1  Apr. 1, 2021

(30) Foreign Application Priority Data

Sep. 30, 2019 (DE) .......................... 102019126320.4

(51) Int. Cl.
*G01R 33/09* (2006.01)
*H01L 43/12* (2006.01)

(52) U.S. Cl.
CPC ......... *G01R 33/093* (2013.01); *G01R 33/091* (2013.01); *H01L 43/12* (2013.01)

(58) Field of Classification Search
CPC ...... G01R 33/093; G01R 33/091; H01L 43/12
See application file for complete search history.

(56) References Cited

U.S. PATENT DOCUMENTS

2007/0223150 A1* 9/2007 Fukuzawa ........... H01F 10/3254
                                                         360/324.11
2010/0214698 A1* 8/2010 Macken ............... G11B 5/3912
(Continued)

FOREIGN PATENT DOCUMENTS

| DE | 102016105479 A1 | 9/2016 |
| DE | 112018002604 T5 | 3/2020 |
| WO | 2018008525 A1 | 1/2018 |

OTHER PUBLICATIONS

Nakano et al., "Magnetic tunnel junctions using perpendicularly magnetized synthetic antiferromagnetic reference layer for wide-dinamic-range magnetic sensors," Applied Physics Letters, vol. 110, Issue 1, Jan. 2017.

*Primary Examiner* — Alesa Allgood
(74) *Attorney, Agent, or Firm* — Harrity & Harrity, LLP

(57) ABSTRACT

Example implementations are concerned with magnetoresistive sensors and with corresponding fabrication methods for magnetoresistive sensors. One example here relates to a magnetoresistive sensor having a layer stack. The layer stack comprises a reference layer having a reference magnetization, which is fixed and has a first magnetic orientation. The layer stack comprises a magnetically free layer. The magnetically free layer has a magnetically free magnetization. The magnetically free magnetization is variable in the presence of an external magnetic field. The magnetically free magnetization has a second magnetic orientation in a ground state. One of the first or the second magnetic orientation is oriented in-plane and the other is oriented out-of-plane. The layer stack comprises a metal multilayer. In this case, either the metal multilayer is arranged adjacent to the magnetically free layer, or the metal multilayer constitutes the magnetically free layer.

18 Claims, 13 Drawing Sheets

(56) References Cited

U.S. PATENT DOCUMENTS

2018/0166627 A1    6/2018  Kim et al.
2018/0366516 A1  12/2018  Kinney et al.
2019/0051822 A1    2/2019  Chatterjee et al.
2019/0355897 A1* 11/2019  Sun .......................... H01L 43/12

* cited by examiner

MAGNETORESISTIVE SENSOR AND FABRICATION METHOD FOR A MAGNETORESISTIVE SENSOR

CROSS REFERENCE TO RELATED APPLICATION

This application claims priority to German Patent Application No. 102019126320.4 filed on Sep. 30, 2019, the content of which is incorporated by reference herein in its entirety.

TECHNICAL FIELD

Example implementations are concerned with magnetoresistive sensors and with corresponding fabrication methods for magnetoresistive sensors.

BACKGROUND

Magnetic field sensors based on the magnetoresistance effect, so-called magnetoresistive sensors, are often used. On account of their high signal level and their high accuracy and also the possibility of integrating them modularly in BICMOS or CMOS technologies, they are often the chosen for use with Hall-based magnetic field sensors. In this case, the group of magnetoresistive sensors comprises AMR, GMR or TMR sensors, for instance. The large number of different magnetoresistive effects is usually abbreviated to xMR, where the "x" serves as a placeholder for the different magnetoresistive effects. xMR sensors can detect the orientation of an applied magnetic field by measuring sine and cosine angle components using monolithically integrated magnetoresistive sensor elements. Here the acronym respectively denotes the magnetoresistive effect used for measuring the respective magnetic field. In this regard, GMR, for instance, stands for Giant MagnetoResistance (GMR), a quantum mechanical magnetoresistance effect that is observed in thin-film structures consisting of alternately ferromagnetic and nonmagnetic conductive layers. TMR stands for Tunnel MagnetoResistance (TMR), which is a magnetoresistive effect that occurs in a magnetic tunnel junction (MTJ), wherein the junction occurs at a thin insulator that separates two ferromagnets from one another. The acronym AMR stands for Anisotropic MagnetoResistance, which is a property of a material in which a dependence of the electrical resistance on the angle between the direction of the electric current (e.g. scanning axis) and the magnetization direction is observed.

SUMMARY

However, these xMR sensors have two limitations in many cases. Firstly, they normally have a relatively small operating range in low linear magnetic fields. In addition, in most variants they are not an alternative to Hall sensors for detecting magnetic fields in the z-direction. Although cross-geometric xMR sensors offer a z-sensitivity, their design is usually unable to yield the desired signal output and to maintain a high linear field range at the same time.

Implementations disclosed herein may overcome these limitations, without adversely affecting the advantages of the xMR technology.

One example relates to a magnetoresistive sensor having a layer stack. The layer stack comprises a reference layer having a reference magnetization, which is fixed and has a first magnetic orientation. The layer stack comprises a magnetically free layer. The magnetically free layer has a magnetically free magnetization. The magnetically free magnetization is variable in the presence of an external magnetic field. The magnetically free magnetization has a second magnetic orientation in a ground state. One of the first or the second magnetic orientation is oriented in-plane and the other is oriented out-of-plane. The layer stack comprises a metal multilayer. In this case, either the metal multilayer is arranged adjacent to the magnetically free layer, or the metal multilayer constitutes the magnetically free layer.

A further example is concerned with a fabrication method for a magnetoresistive sensor. The method comprises fabricating a layer stack of the magnetoresistive sensor by forming a reference layer having a reference magnetization, which is fixed and has a first magnetic orientation. Forming the layer stack comprises forming a magnetically free layer. The magnetically free magnetization has a second magnetic orientation in a ground state. One of the first or the second magnetic orientation is oriented in-plane and the other is oriented out-of-plane. Forming the layer stack comprises forming a metal multilayer. In this case, either the metal multilayer is arranged adjacent to the magnetically free layer, or the metal multilayer constitutes the magnetically free layer.

BRIEF DESCRIPTION OF THE FIGURES

Some examples of devices and/or methods are explained in greater detail merely by way of example below with reference to the accompanying figures, in which.

DESCRIPTION

Various examples will now be described more thoroughly with reference to the accompanying figures, in which some examples are illustrated. Further examples can cover all modifications, counterparts and alternatives that fall within the scope of the disclosure. In the figures, the thicknesses of lines, layers and/or regions may be exaggerated for elucidation purposes. Throughout the description of the figures, identical or similar reference signs refer to identical or similar elements which can be implemented identically or in modified form in a comparison with one another, while they provide the same or a similar function.

It goes without saying that if one element is designated as "connected" or "coupled" to another element, the elements can be connected or coupled directly or via one or more intermediate elements. If two elements A and B are combined using an "or", this should be understood such that all possible combinations are disclosed, e.g. only A, only B, and A and B, unless explicitly or implicitly defined otherwise. An alternative wording for the same combinations is "at least one of A and B" or "A and/or B". The same applies, mutatis mutandis, to combinations of more than two elements.

Unless defined otherwise, all terms (including technical and scientific terms) are used here in their customary meaning in the field with which examples are associated.

Figure 1A:
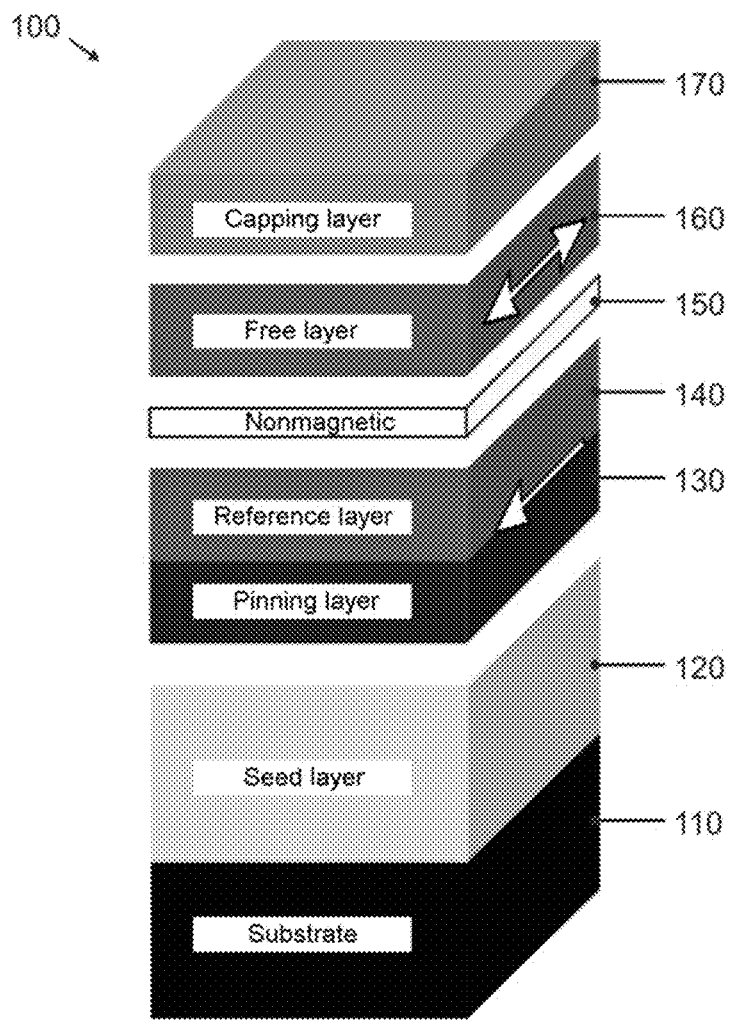
FIGS. 1a and 1b show schematic diagrams of layer stacks of xMR sensors.
Figure 1B:
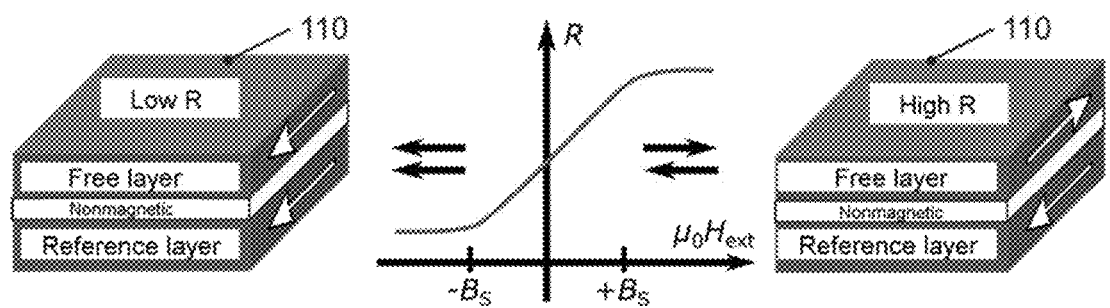

The magnetoresistive layers of xMR-based sensors are typically embodied in an in-plane geometry, which means that the magnetic orientation of a reference layer (RL) and of a magnetically free layer (FL) is either parallel or antiparallel to one another, both orientations being in-plane and in the same direction, e.g. in the x-direction or the y-direction. FIG. 1a shows a schematic diagram of a layer stack 100 of an xMR sensor in which both the reference layer and the magnetically free layer are embodied in-plane. In this case, the layer stack 100 comprises a substrate 110, a seed layer 120, a pinning layer 130, a reference layer 140, a nonmagnetic layer 150, a magnetically free layer 160 and a capping layer 170. Both the magnetically free layer 160 and the reference layer 140 have an in-plane anisotropy. The magnetically free layer can be for example a metal layer (for instance a copper layer) if the xMR sensor is a GMR sensor, or an insulation layer (for instance a magnesium oxide layer, MgO) if the xMR is a TMR sensor. FIG. 1b shows a diagram of a dependence between the resistance and the magnetic field. In this case, a low resistance is achieved if the anisotropy of the magnetically free layer and the anisotropy of the reference layer are oriented parallel to one another (see reference sign 180), and a high resistance is achieved if the anisotropy of the magnetically free layer and the anisotropy of the reference layer are oriented antiparallel to one another (see reference sign 190).

In this case, in-plane means that the magnetic orientation of the layer extends along a largest (lateral) extension of the layers (for instance of the reference layer) of the layer stack. In other words, a plane is spanned along the largest extent of the individual layers of the layer stack. If the magnetization of the layer extends along the plane, then the layer has an "in-plane magnetization" or, in other words, an in-plane anisotropy or an anisotropy within the plane.

The contrast to this is an out-of-plane magnetization. If the magnetization of the layer extends perpendicular to the plane, then the layer has an "out-of-plane magnetization" or, in other words, an out-of-plane anisotropy or an anisotropy perpendicular to the plane. In this case, the plane defines an x- and a y-direction component. A z-direction component extends perpendicular to the plane. Hereinafter a lateral direction or extent and a vertical direction or extent are also defined relative to the plane. In this case, the lateral direction extends parallel to the x/y-direction component, and the vertical direction extends parallel to the z-direction component. The concept described above offers no sensitivity in the z-direction since both magnetic orientations extend in-plane.

Figure 2A:
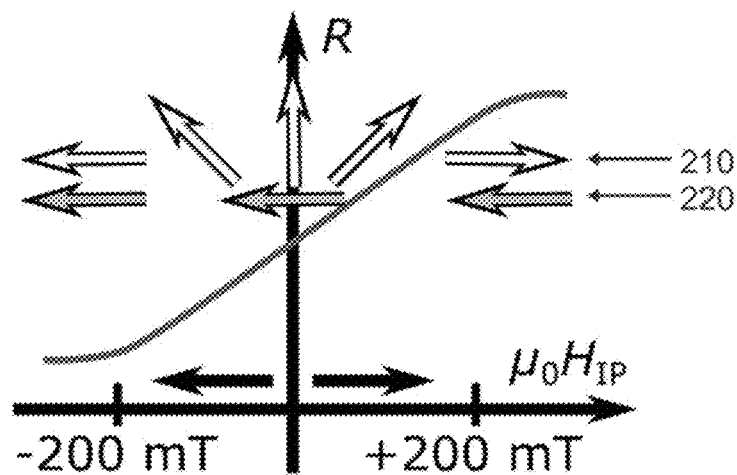
FIGS. 2a to 2c show diagrams of a dependence between the resistance and an external magnetic field in two different configurations.
Figure 2B:
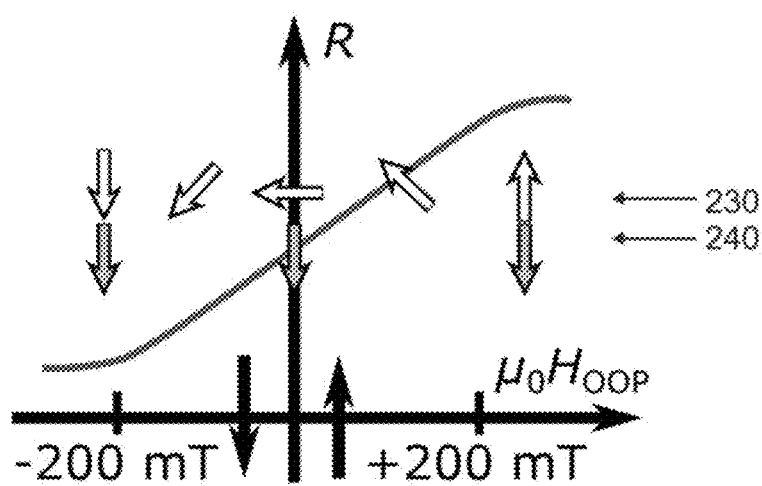

One possibility for enabling a sensitivity in the z-direction is the use of cross-geometric anisotropies in reference layer and magnetically free layer. A cross-geometric anisotropy between two layers is present if one of the two layers has an in-plane anisotropy and the other layer has an out-of-plane anisotropy. Two different approaches are conceivable here— in this regard, in a first approach, the anisotropy of the magnetically free layer in the ground state (that is to say if no external magnetic field is influencing the magnetically free layer) can be oriented out-of-plane, and the anisotropy of the reference layer in-plane. This approach is shown in FIG. 2a. FIG. 2a shows a diagram of a dependence between the resistance R (y-axis) and the magnetic field (x-axis) in such an approach, wherein the reference sign 210 denotes the magnetization of the magnetically free layer depending on the external magnetic field and reference sign 220 denotes the magnetization of the reference layer. In a second approach, the anisotropy of the magnetically free layer in the ground state can be oriented in-plane (that is to say if no external magnetic field is influencing the magnetically free layer), and the anisotropy of the reference layer out-of-plane. This approach is shown in FIG. 2b. Here reference sign 230 denotes the magnetization of the magnetically free layer and reference sign 240 denotes the magnetization of the reference layer. In both cases the resistance is low if the magnetizations are oriented parallel to one another, and high if the magnetizations are oriented antiparallel to one another.

Figure 2C:
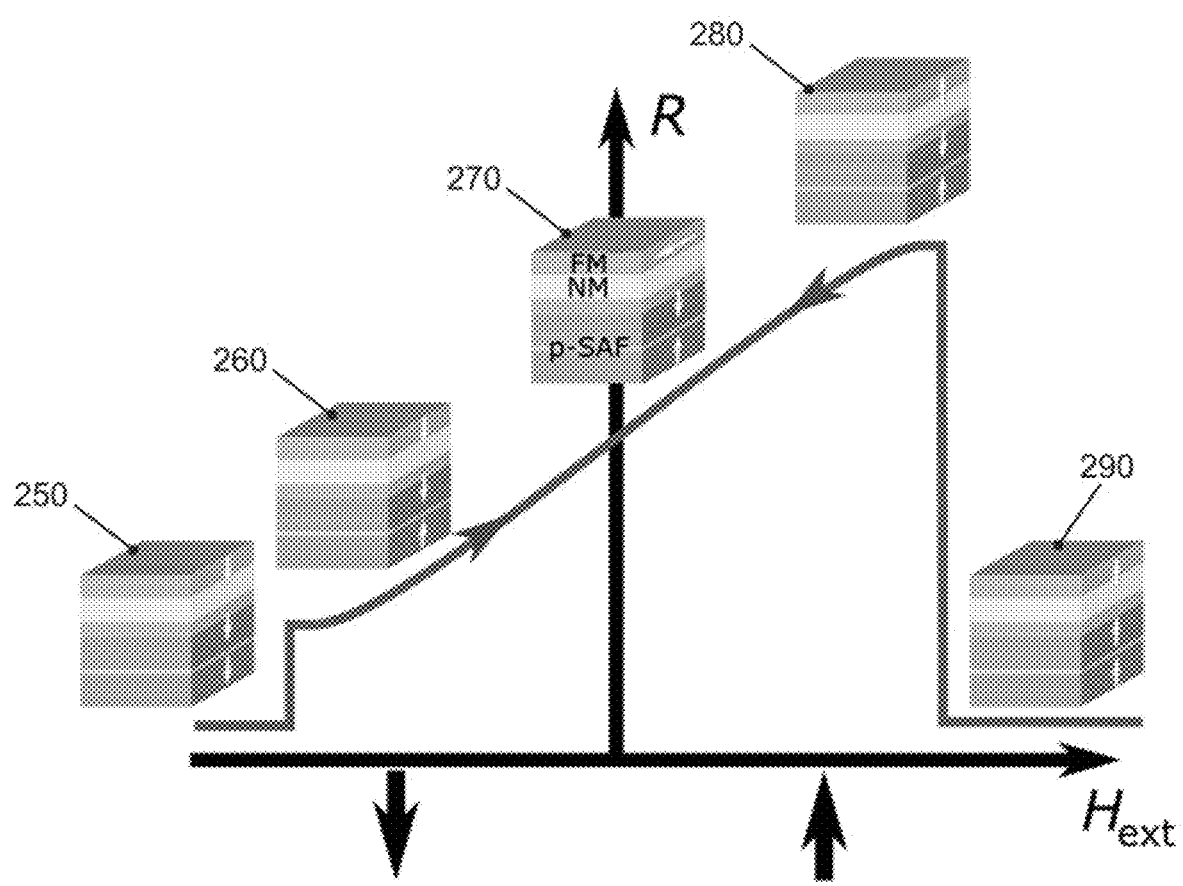

FIG. 2c shows a diagram of a transfer curve of cross-geometric xMR sensors in an out-of-plane field. The saturation of the magnetically free layer in the z-direction is optimized for p-SAF saturation fields in the example in FIG. 2c. In this case, 5 states 250; 260; 270; 280; and 290 are shown. In the ground state (state 270), the magnetization of the magnetically free layer is oriented in-plane. The magnetization of the reference layer is oriented out-of-plane.

Once again the strength of the external magnetic field Hext is plotted on the x-axis, and the resistance R on the y-axis. In states 250 and 290, the saturation range of the p-SAF is attained. In the remaining states 260 to 280, the xMR sensor is in the operating range, wherein the magnetization of the magnetically free layer is oriented parallel to the magnetization of the reference layer in state 260, orthogonal to the magnetization of the reference layer in state 270, and antiparallel to the magnetization of the reference layer in state 280, such that the resistance rises between states 260 and 280.

One technology which utilizes the magnetoresistive effect is that of magnetoresistive random access memory (MRAM). Here both the reference layer and the magnetically free layer have an out-of-plane magnetic anisotropy, also called perpendicular magnetic anisotropy (PMA), which typically consists of thin CoFeB/MgO/CoFeB layers. The PMA here usually results from an interface effect between CoFeB and MgO, and if this is the case, the PMA is dominant only for sufficiently thin layers. From a technical standpoint this enables a sensitivity in the z-direction. The purpose of such structures differs greatly from magnetic sensors, however, since in MRAM the focus is on writing and storing a specific magnetic orientation and therefore avoiding high linear ranges. Furthermore, the magnetically free layer in both technologies consists of relatively simple material combinations, typically only CoFeB or CoFeB/CoFe layers with additional nonmagnetic capping layers.

A further approach of an xMR-based sensor having a high linear range and z-sensitivity is the use of cross-geometric anisotropies of reference layer and magnetically free layer. Here the reference layer consists for example of a perpendicular synthetic antiferromagnet (p-SAF), which uses a metal multilayer (for instance Co/Pd or Co/Pt) coupled to the MRAM inspired CoFeB/MgO system in order to achieve the PMA. Here the term "metal multilayer" relates to a layer system which comprises (or consists of) two or more (vertically) adjacently arranged metallic layers. The magnetically free layer is then designed with an in-plane anisotropy, typically CoFeB having a thickness that guarantees an in-plane anisotropy. This type of sensor is operated parallel to the reference layer, e.g. in the z-direction, which means that the magnetically free layer is operated along its magnetically hard axis. In some configurations this results in the high magnetic field range of a few hundred milliteslas.

Figure 3A:
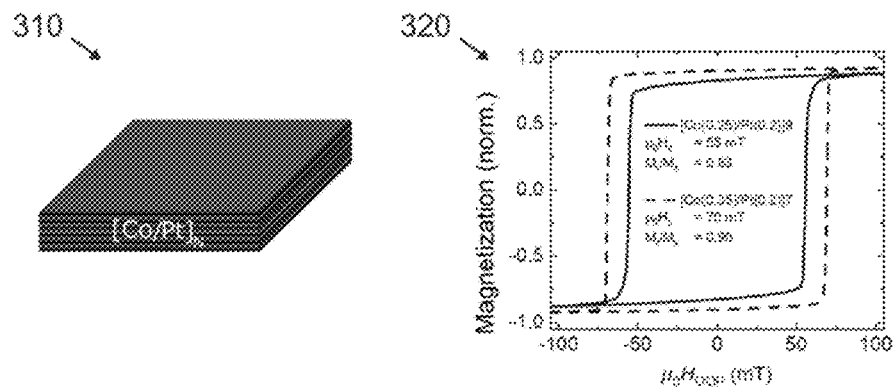
FIGS. 3a to 3c show schematic diagrams of different possibilities for achieving an out-of-plane magnetization.
Figure 3B:
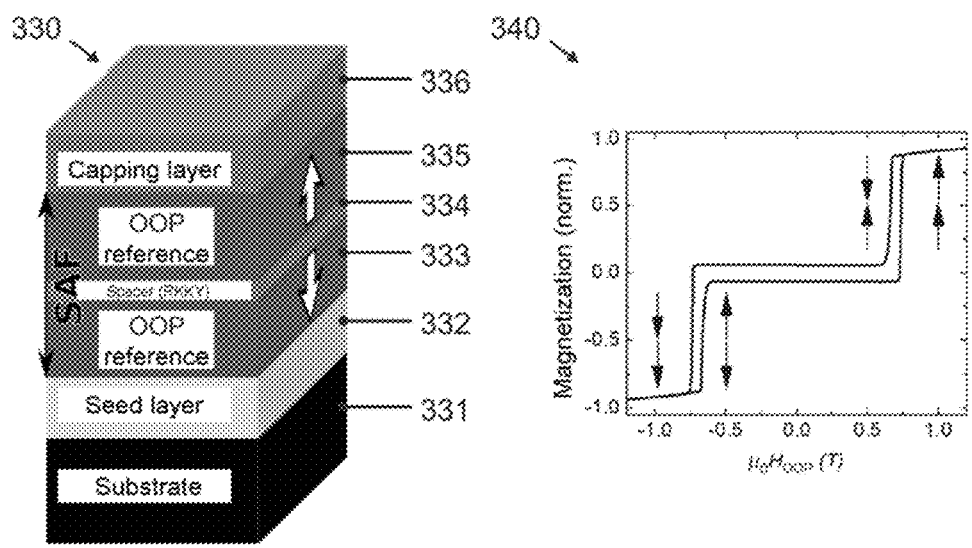
Figure 3C:
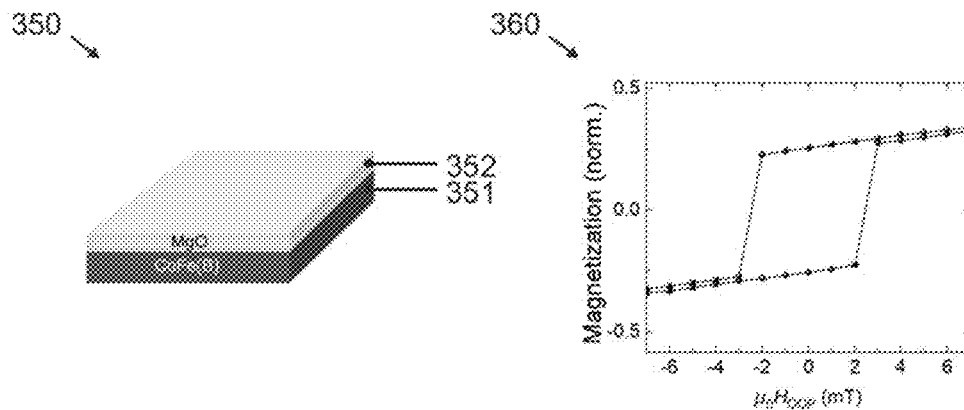

FIGS. 3a to 3c show different possibilities for achieving an out-of-plane magnetization. FIG. 3a shows the possibility of achieving an out-of-plane anisotropy using a metal multilayer system.

In this case, the layers of the metal multilayer system 310 can be fabricated from Co/Pt or Co/Pd, for example. Reference sign 320 denotes a diagram showing the normalized magnetization (y-axis) of such a metal multilayer system 310 under the influence of an out-of-plane magnetic field $\mu_0 H_{OOP}$. In this case, the solid lines show the values for a metal multilayer system with $$[Co(0.25)/Pt(0.2)]_9 \left( \mu_0 H_c = 55 \text{ mT}, \frac{M_I}{M_S} = 0.83 \right)$$

and the dashed lines show the values for a metal multilayer system with $$[Co(0.35)/Pt(0.2)]_7 \left( \mu_0 H_c = 70 \text{ mT}, \frac{M_I}{M_S} = 0.9 \right).$$

In the present disclosure, the following notation is chosen here for metal multilayers: $[a(d_a)/b(d_b)]_N$, where a and b are in each case chemical elements and compounds, $d_a$ indicates the thickness of a layer of a, $d_b$ indicates the thickness of a layer of b, in each case in units of nanometers (nm), and N indicates the number of a-layers and the number of b-layers, the a-layers and the b-layers being arranged alternately.

FIG. 3b shows a possibility of achieving an out-of-plane anisotropy using a synthetic antiferromagnet (SAF). In this case, the layer stack 330 comprises a substrate 331, a seed layer 332, a first out-of-plane reference layer 333, a spacer 334, which functions as Ruderman-Kittel-Kasuya-Yosida (RKKY) coupling, a second out-of-plane reference layer 335 (the layers 333 to 335 form the synthetic antiferromagnet SAF) and a capping layer 336. Reference sign 340 denotes a diagram showing the normalized magnetization (y-axis) of such a layer stack 330 under the influence of an out-of-plane magnetic field $\mu_0 H_{OOP}$.

FIG. 3c shows a possibility of achieving an out-of-plane anisotropy using a CoFeB/MgO orbital hybridization at the interface. In this case, the layer stack 350 comprises a CoFe(B) layer 351 and an MgO layer 352. Reference sign 360 denotes a diagram showing the normalized magnetization (y-axis) of such a layer stack 350 under the influence of an out-of-plane magnetic field $\mu_0 H_{OOP}$.

The out-of-plane field saturation of the magnetically free layer in-plane is typically in the teslas range, which reduces the xMR effect in the linear range. In order to reduce the saturation field, for TMR sensors it is possible to reduce the CoFeB thickness of the magnetically free layer and for GMR sensors, if here the free layer is constructed from Co followed by a Pt capping layer, it is possible to reduce the Co thickness of the magnetically free layer. This increases the influence of the perpendicular anisotropy at the MgO/CoFeB interface and Co/Pt interface, respectively, with the result that a magnetic saturation in the z-direction occurs at lower fields. While this ultimately increases the sensitivity of the sensor, the change in thickness also greatly increases the nonlinearity (NL) and reduces the linear range (see FIG. 4b).

Figure 4A:
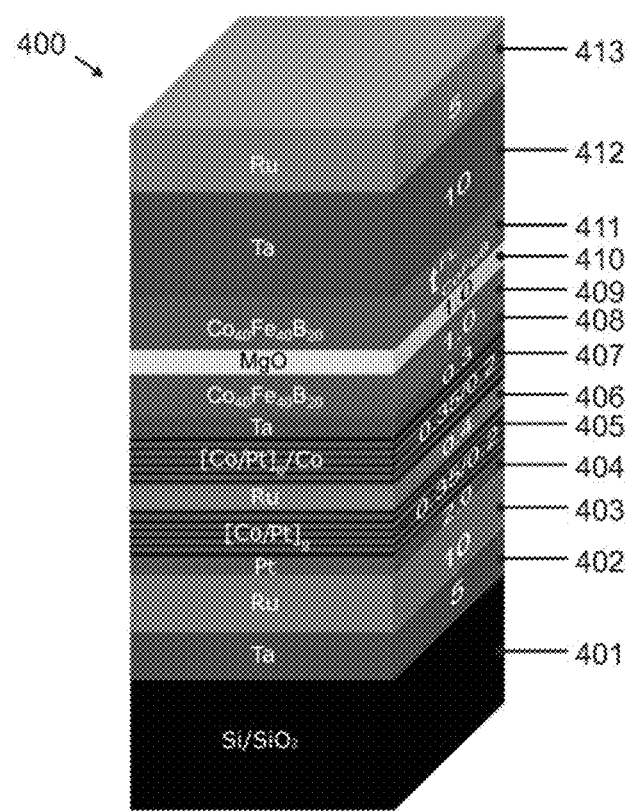
FIG. 4a shows a schematic diagram of a layer stack of a TMR magnetic field sensor.
Figure 4B:
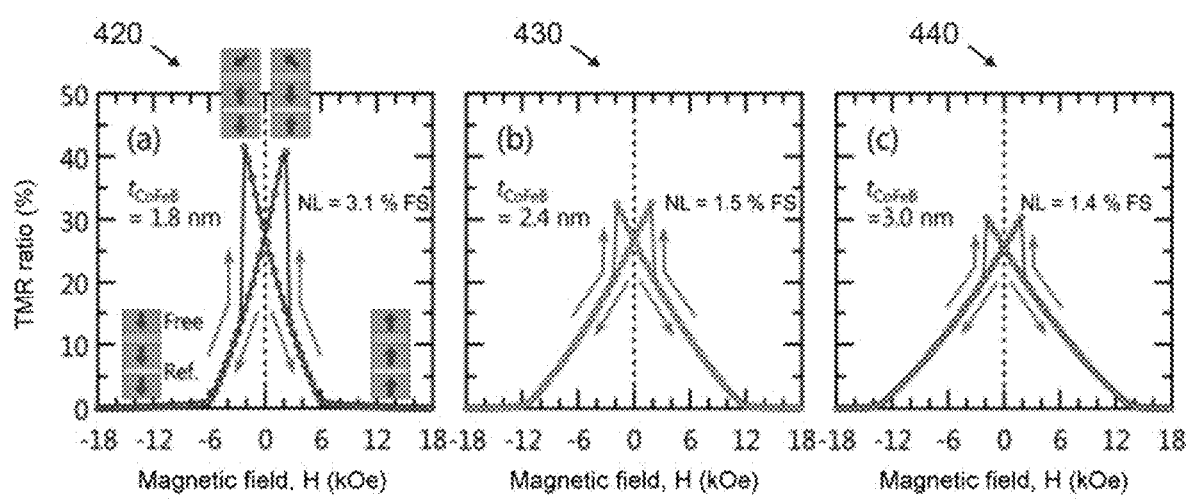
FIG. 4b shows a diagram of a TMR ratio under the influence of an external magnetic field for different layer thicknesses of a magnetically free layer.

FIG. 4a shows a schematic illustration of a layer stack 400 of a cross-geometric TMR sensor having an out-of-plane reference layer and an in-plane magnetically free layer. The layer stack 400 comprises, from bottom to top, a substrate 401 (composed of Si/SiO$_2$), a tantalum layer 402 (5 nm), a ruthenium layer 403 (10 nm), a platinum layer 404 (2 nm), a [Co/t]$_9$ multilayer 405 (0.35 nm/0.2 nm), a ruthenium layer 406 (0.4 nm), a [Co/t]$_9$/Co multilayer 407 (0.35 nm/0.2 nm), a tantalum layer 408 (0.3 nm), a Co$_{40}$Fe$_{40}$B$_{20}$ reference layer 409 (1 nm), an MgO tunnel barrier layer 410, a Co$_{40}$Fe$_{40}$B$_{20}$ magnetically free layer 411 (1.8 nm, 2.4 nm, 3.0 nm, see FIG. 4b), a tantalum layer 412 (10 nm) and a ruthenium layer 413 (5 nm). FIG. 4b, from T. Nakano et al., Appl. Phys. Lett. 110, 012401 (2017); https://doi.org/10.1063/1.4973462, shows, for different thicknesses of the magnetically free layer 411 (reference sign 420: 1.8 nm, reference sign 430: 2.4 nm, reference sign 440: 3 nm), a TMR ratio (in %) under the influence of a magnetic field H (in kOe) using such a cross-geometric layer stack 400. As the layer thickness of the magnetically free layer decreases, the TMR ratio between p-SAF saturation fields can be increased, but also results in an increased nonlinearity (3.1% at 1.8 nm, 1.5% at 2.4 nm, 1.4% at 3 nm). In this concept, the saturation fields of the magnetically free layer are too high. Reducing the thickness of the CoFeB magnetically free layer reduces the saturation field (PMA interface effect). As a result, the nonlinearity (NL) also increases from 1.4% FS (Full Scale, here 200 kOe or 200 mT) to 3.1% FS. The synthetic antiferromagnet emerges from the antiferromagnetic coupling. 3.1% FS means, then, that in the case of a full scale measurement (+/−200 mT) a deviation by 3.1% of the measured output from the fitted output can be seen. It is additionally known that the CoFeB thickness has an influence on the TMR effect, such that reducing the thickness is possibly not advantageous. Moreover, the concept is possibly not applicable to GMR sensors (since no MgO layer is provided), unless Co/Pt is used in the magnetically free layer instead of the more commonly used CoFe. Therefore, a thickness-independent possibility for changing the saturation field may be used.

Example implementations of the present disclosure provide a new approach for reducing the saturation field of the magnetically free layer which is suitable both for TMR sensors and for GMR sensors and enables a saturation-independent thickness optimization of the magnetically free layer. The present disclosure yields new concepts for the layer system of the magnetically free layer of cross-geometric xMR sensors which can enable a saturation of the magnetically free layer in fields comparable to the saturation of the reference layer. This concept has the potential of tripling the usable xMR effect of cross-geometric xMR sensors (see, for instance, FIG. 11b, left-hand side, which shows a tripling from 1.2% to 3.75% GMR swing), which opens up this technology as a promising z-sensitive magnetic sensor. An elucidated transfer curve of such a z-sensitive magnetic sensor is illustrated in FIG. 2c.

Figure 5A:
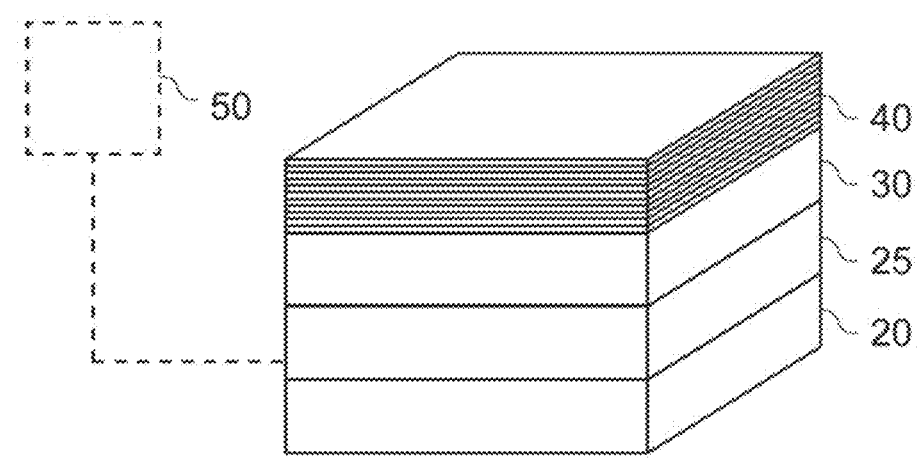
FIGS. 5a and 5b show schematic diagrams of example implementations of a magnetoresistive sensor having a layer stack.
Figure 5B:
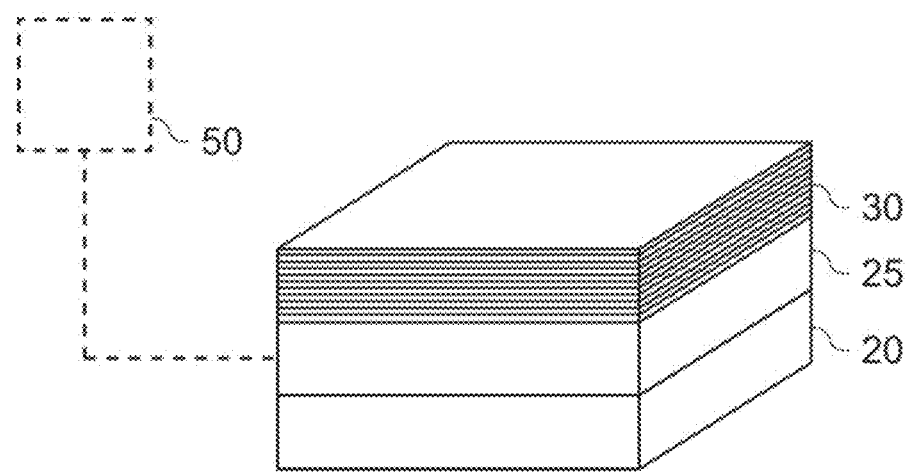

FIGS. 5a and 5b show schematic diagrams of example implementations of a magnetoresistive sensor having a layer stack 500a; 500b. The layer stack comprises a reference layer 20 having a reference magnetization, which is fixed and has a first magnetic orientation. The layer stack furthermore comprises a magnetically free layer 3. The magnetically free layer has a second magnetic orientation in a ground state. One of the first or the second magnetic orientation is oriented in-plane and the other is oriented out-of-plane. The layer stack comprises a metal multilayer 30; 40. In FIG. 5a, the metal multilayer 40 is arranged adjacent to the magnetically free layer. In FIG. 5b, the metal multilayer 30 constitutes the magnetically free layer.

The layer stacks 500a; 500b in FIGS. 5a and 5b furthermore comprise a further layer 25, which is arranged between the reference layer 20 and the magnetically free layer 30. If the magnetoresistive sensor is based on a tunnel magnetoresistance effect (TMR), then the further layer 25 can be a tunnel barrier layer, for instance. If the magnetoresistive sensor is based on a giant magnetoresistance effect (GMR), then the further layer 25 can be a nonmagnetic layer. In both cases, both the reference layer 20 and the magnetically free layer 30 can be arranged directly adjacent to the further layer. It is assumed in all cases that the layers of the layer stack are arranged vertically with respect to one another or are vertically adjacent.

Example implementations of the present disclosure are concerned with magnetoresistive sensors and with layer stacks for magnetoresistive sensors. Magnetoresistive sensors are magnetic field sensors whose functioning is based on a resistance being altered by a magnetic field. The resistance can then be determined with the aid of a sensor circuit (for instance on the basis of a voltage drop across the resistance) and be used to make statements about the magnetic field. In at least some example implementations, the magnetoresistive sensor can thus comprise a sensor circuit 50. A magnetic field sensor includes one or more sensor elements, for example, which can be configured to measure one or more properties of a magnetic field (for instance one or more elements from the group of a magnetic field flux density, a field strength, a field angle, a field direction, a field orientation, etc.). In other words, the sensor circuit 50 can comprise one or more sensor elements which can be configured to measure one or more properties of a magnetic field. The magnetic field can be generated by a magnet, a current-carrying conductor (e.g. a wire), the earth or some other magnetic field source. Each sensor element can be configured for example to generate a sensor signal (e.g. a voltage signal) as a reaction to one or more magnetic fields impinging on the sensor element. Consequently, a sensor signal is an indicator of the size and/or the orientation of the magnetic field impinging on the sensor element.

The one or more sensor elements can be configured to detect one or more direction components of an external magnetic field across the layer stack in order to generate one or more voltages corresponding to the one or more direction components of the external magnetic field. In this case, the magnetoresistive sensor can comprise for example a first and a second sensor plane, in which the magnetoresistive sensor is sensitive vis-à-vis an external magnetic field, for instance an in-plane sensor plane and an out-of-plane sensor plane, or a first sensor plane along the x/y-direction components and a second sensor plane along the z-direction component. In this regard, the first sensor plane can be oriented for example parallel to the largest lateral extent of the reference layer. The second sensor plane can be oriented perpendicular to the largest lateral extent of the reference layer. Analogously, a first direction component of the one or more direction components can be oriented parallel to the first magnetic orientation and a second direction component of the one or more direction components can be oriented parallel to the second magnetic orientation. If the first magnetic orientation is oriented in-plane, for example, then the first direction component can be an x- or y-direction component; if it is oriented out-of-plane, then the first direction component can be a z-direction component. This is analogously applicable to the second direction component: if the second magnetic orientation is oriented in-plane, for example, then the second direction component can be an x- or y-direction component; if it is oriented out-of-plane, then the second direction component can be a z-direction component. The magnetoresistive sensor can comprise a plurality of layer stacks, for example, in order to detect a plurality of direction components by way of a plurality of sensor elements (by way of the plurality of layer stacks).

The layer stack comprises the reference layer 20 having the reference magnetization, which is fixed and has the first magnetic orientation. In this case, the first magnetic orientation can be oriented out-of-plane, for example. This can be done for example by using a synthetic antiferromagnet (SAF) in the reference system of the reference layer (wherein the SAF is constituted from elements having PMA (that is to say, for example, metal multilayers and/or CoFe (B)/MgO)), by likewise using a metal multilayer as reference layer (for instance Co/Pt or Co/Pd), or by making use of spin-orbit interaction and/or an orbital hybridization at the interface between MgO and CoFe(B) (given sufficiently thin layers CoFe(B)), see FIGS. 3a to 3c, for instance. Alternatively, the first magnetic orientation can also be oriented in-plane, for instance with the use of a "simple" reference layer. The reference layer can be for example a cobalt layer (Co), a cobalt-iron layer (CoFe) or a cobalt-iron-boron layer (CoFeB).

The layer stack furthermore comprises the magnetically free layer 30. The magnetically free magnetization has the second magnetic orientation in the ground state. In this case, the ground state is a state in which an influence of an external magnetic field on the magnetically free layer is not present or is negligibly small. In this case, many properties of the magnetically free layer depend on the metal multilayer, be it because the metal multilayer is arranged adjacent to the magnetically free layer or be it because the metal multilayer constitutes the magnetically free layer. Instead of a single layer, e.g. CoFeB or CoFe, either the metal multilayer system is coupled to the magnetically free layer, or the metal multilayer constitutes the magnetically free layer. Thus, in one concept (concept 1), the metal multilayer can be embodied separately from the magnetically free layer and can be arranged directly adjacent to, or else coupled to, the magnetically free layer. This concept is shown in FIGS. 5a, 6b, 7a, 7c, FIG. 8 reference sign 820 and FIG. 9 reference sign 920. In this case, the magnetically free layer 30 can be arranged between the metal multilayer 40 and the reference layer 20. If the magnetically free layer 30 is embodied in a manner adjacent to, or coupled to, the metal multilayer, then the magnetically free layer can likewise be a cobalt layer (Co), a cobalt-iron layer (CoFe) or a cobalt-iron-boron layer (CoFeB). In a second concept, the metal multilayer 30 can constitute the magnetically free layer 30. In other words, the metal multilayer 30 can be the magnetically free layer. This concept is shown in FIGS. 5b, 6c, 7b, 7d, FIG. 8 reference sign 830 and FIG. 9 reference sign 930. In both concepts, the magnetically free layer in-plane acquires a (small) perpendicular anisotropy (PMA) from the metal multilayer system. The origin of PMA is the spin-orbit interaction and the orbital hybridization.

In principle, the metal multilayer is characterized in that it comprises a plurality of metal layers, that is to say a plurality of layers fabricated from metal or a metal alloy. In this case, the metal multilayer can comprise for example at least two layers, for instance two layers, four layers, six layers, eight layers or a further multiple of two. In this case, the plurality of metal layers can comprise for example two (or more than two) different types of metal layers. In other words, the metal multilayer 30; 40 can comprise a first plurality of layers of a first metal or of a first metal alloy and a second plurality of layers of a second metal. The different layers can then bring about for example the interface effect—already mentioned above—at the interface between the layers, which either ensures that the magnetic orientation of the metal multilayer is out-of-plane or adds an out-of-plane component at least in a net in-plane magnetic orientation. The different layers can then be arranged alternately in the metal multilayer. In other words, the layers of the first and the second plurality can be arranged alternately in the metal multilayer. In this case, layers of the second plurality can be arranged equidistantly in the metal multilayer, e.g. all layers of the first plurality of layers can have a first thickness, and all layers of the second plurality of layers can have a second thickness (in each case within the scope of the fabrication tolerances).

In principle, a plurality of material combinations are conceivable for the metal multilayer. In this case, by way of example, the material combinations Co/Pt, Co/Pd, Co/Au, Co/Ni, Co/Cu, Fe/Pt, Fe/Pd, Fe/Au, Fe/Cu or Fe/Ag can be used for the metal multilayer. In other words, the first plurality of layers can comprise cobalt (Co) and the second plurality of layers can comprise one from platinum (Pt), palladium (Pd), gold (Au), nickel (Ni) and copper (Cu). Alternatively, the first plurality of layers can comprise iron (Fe) and the second plurality of layers can comprise one from platinum, palladium, gold, copper and silver. In this case, by way of example, a metal alloy, for instance a cobalt-iron alloy (CoFe) or a cobalt-iron-boron alloy (CoFeB), can be used for the first plurality of layers. In this regard, the first plurality of layers can be fabricated from a cobalt-iron alloy or a cobalt-iron-boron alloy, for instance if the metal multilayer constitutes the magnetically free layer. In this case, the anisotropy of the metal multilayer, and thus of the magnetically free layer, can be influenced by the choice of layer thicknesses—if larger layer thicknesses are chosen for the first plurality of layers, then the net anisotropy tends toward a net in-plane orientation; if smaller layer thicknesses are chosen for the second plurality of layers, then the net anisotropy tends toward a net out-of-plane orientation.

As already described above, the first magnetic orientation and the second magnetic orientation are oriented perpendicular to one another since respectively one of the orientations is oriented in-plane and the other out-of-plane. Two combinations are conceivable here. In a first combination, the first magnetic orientation is oriented out-of-plane and the second magnetic orientation is oriented in-plane. In a second combination, the first magnetic orientation is oriented in-plane and the second magnetic orientation is oriented out-of-plane.

Figure 6A:
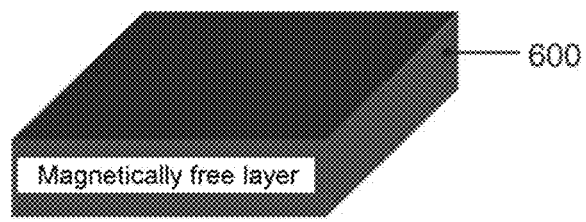
FIGS. 6a to 6c show schematic diagrams of different concepts for a magnetically free layer.
Figure 6B:
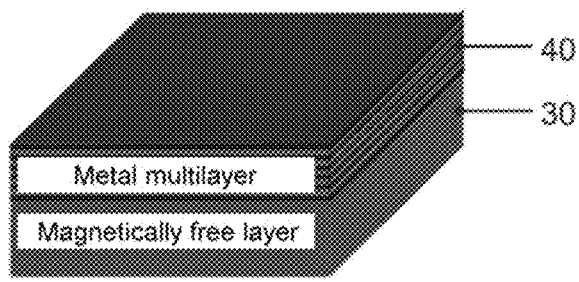
Figure 6C:
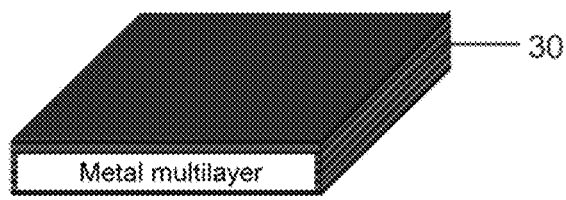

FIGS. 6a to 6c show the differences between the implementations of the magnetically free layer. FIG. 6a shows a simple magnetically free layer 600, which is not coupled to a metal multilayer or is not constituted by a metal multilayer. FIG. 6b shows a system composed of the magnetically free layer 30 and a separate metal multilayer 40. In FIG. 6c, the metal multilayer 30 constitutes the magnetically free layer. This enables an adaptability of the magnetization saturation by the use of metal multilayer concepts in cross-geometric xMR sensors. In this case, the use of the concept from FIG. 6b makes it possible to adapt the saturation magnetization by adding an out-of-plane anisotropy to the coupled layer. The design of the magnetically free layer as a metal multilayer in FIG. 6c makes it possible to tune saturation magnetizations using design parameters such as thickness and multilayer repetition.

The manner of functioning is explained below on the basis of example implementations in which the magnetically free layer has a net in-plane magnetization. However, example implementations in which the magnetically free layer has an out-of-plane magnetization are also conceivable.

In a coupled magnetically free layer (concept 1), the plane-anisotropic magnetically free layer (e.g. CoFe(B)) usually used can be sputtered on the tunnel barrier (TB, e.g. MgO) in a TMR sensor, or on a nonmagnetic metal (NM, e.g. copper) in a GMR sensor, and can subsequently be coupled to the magnetically free layer by way of an exchange interaction with an out-of-plane metal multilayer, such as $[Co(Fe)/Pt]_N$ or $[Co(Fe)/Pd]_N$, for example. In this case, the simple magnetically free layer 30 can have a dominant in-plane anisotropy, to which a small PMA is added by the metal multilayer 40 by way of the coupling. One example of a magnetically free layer in such a concept is CoFe(3 nm)/[Co(0.45 nm)/Pt(0.3 nm)]$_3$, wherein CoFe(3 nm) constitutes the magnetically free layer and [Co(0.45 nm)/Pt(0.3 nm)]$_3$ constitutes the metal multilayer.

In a magnetically free layer consisting of a metal multilayer, the magnetoresistive material of the magnetically free layer (e.g. CoFe), can be pervaded equidistantly by thin metal interlayers (e.g. Pt). By choosing sufficiently thick magnetoresistive layers, the net anisotropy can be designed in-plane, but have a small perpendicular anisotropy on account of the metallic interlayers. One example of a magnetically free layer in such a concept is [CoFe(0.8 nm)/Pt (0.25 nm)]$_3$.

In both concepts the net in-plane anisotropy is maintained, such that the xMR sensor is still operated along the hard axis of the magnetically free layer, which results in high linear field ranges. However, the added PMA in the magnetically free layer enables lower saturation fields, which are adjustable by way of layer thicknesses and multilayer repetition numbers. Ideally the magnetically free layer is saturated in the z-direction at the p-SAF saturation fields, such that the entire spectrum of the parallel and antiparallel orientation of reference layer and magnetically free layer is utilized, which results in a high field sensitivity. By appropriately choosing the layer thicknesses in a different way, it is also possible to implement a net out-of-plane magnetization for the metal multilayer or the magnetically free layer coupled to the metal multilayer.

Figure 7A:
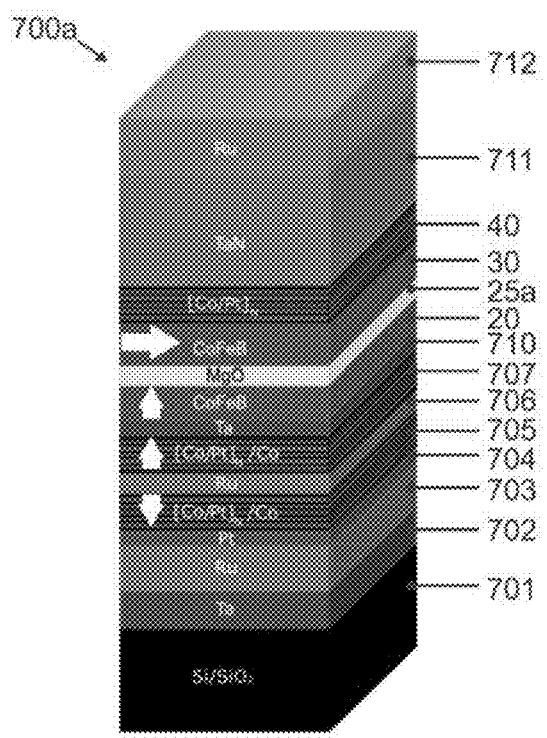
FIGS. 7a to 7d show schematic diagrams of example implementations of layer stacks.
Figure 7B:
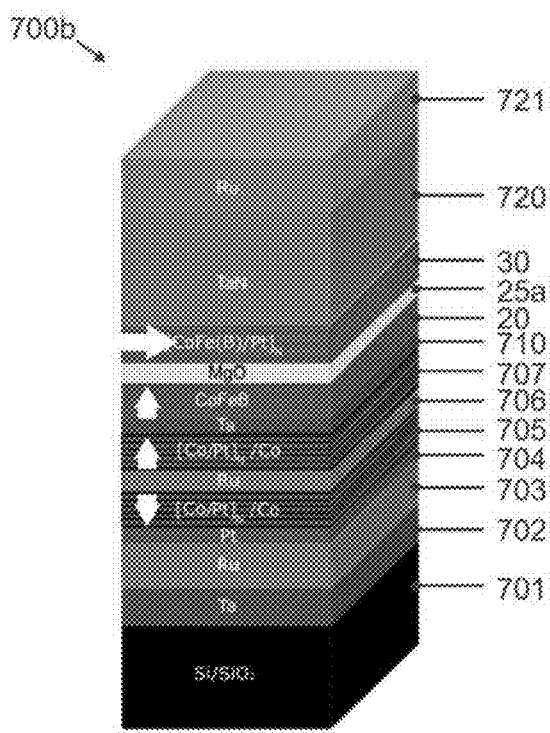
Figure 7C:
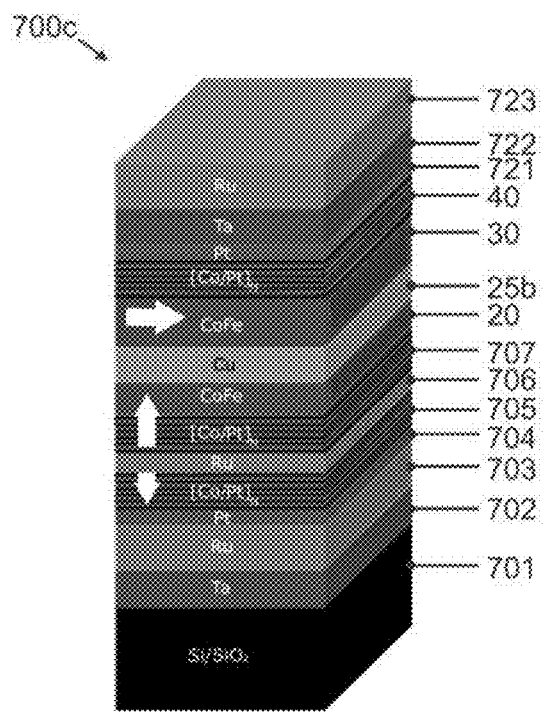
Figure 7D:
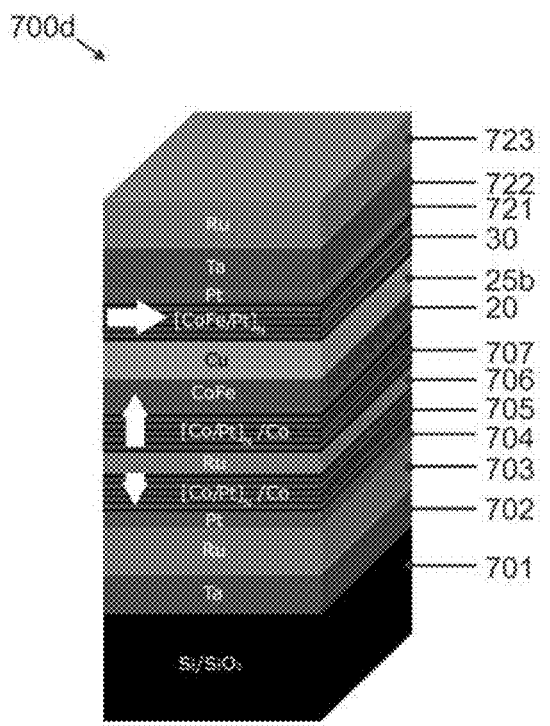

Elucidated examples of the respective layer stack systems are illustrated in FIGS. 7a to 7c. In the layer stack system in FIGS. 7a to 7d, the reference layers have an out-of-plane anisotropy and the magnetically free layers have an in-plane anisotropy. In this case, in the layer stacks 700a and 700c in FIGS. 7a and 7c, the metal multilayer 40 is coupled to the magnetically free layer 30. In the layer stacks 700b and 700c in FIGS. 7b and 7d, the metal multilayer 30 constitutes the magnetically free layer 30. All the examples in FIGS. 7a to 7d have the layers 701 to 707 in common. The layer stacks thus comprise at least (from bottom to top) a substrate 701 (Si/SiO$_2$), a tantalum layer 702, a ruthenium layer 703, a platinum layer 704, a [Co/Pt]$_N$/Co metal multilayer 705, a ruthenium layer 706, and a further [Co/Pt]$_N$/CO metal multilayer 707.

The layer stacks 700a and 700b are layer stacks of a TMR magnetic field sensor, for example. In other words, the magnetoresistive sensor can be based on a tunnel magnetoresistance, TMR, effect. In TMR magnetoresistive sensors, the further layer 25 is a tunnel barrier layer of the magnetoresistive sensor. In other words, the layer stack in this case comprises a tunnel barrier layer 25; 25a, which can be fabricated from magnesium oxide, for example, and which is arranged between the magnetically free layer and the reference layer. The layer stack 700a thus furthermore comprises, following on from the further [Co/Pt]$_N$ metal multilayer 707, a tantalum layer 710, a CoFeB layer 20 (the reference layer), an MgO layer 25a (the tunnel barrier layer), a CoFeB layer 30 (the magnetically free layer), a [Co/Pt]$_N$ metal multilayer 40, which is coupled to the CoFeB layer 30, a TaN layer 711 and a ruthenium layer 712. The layer stack 700b comprises, instead of the CoFeB layer 30 and the coupled [Co/Pt]$_N$ metal multilayer 40, a [CoFe(B)/Pt]$_N$ metal multilayer 30, which constitutes the magnetically free layer.

The layer stacks 700c and 700d are layer stacks of a GMR magnetic field sensor, for example. In other words, the magnetoresistive sensor can be based on a giant magnetoresistance, GMR, effect. In GMR magnetoresistive sensors, the further layer 25 is a nonmagnetic layer 25b of the GMR magnetoresistive sensors. In other words, the layer stack in this case comprises a nonmagnetic layer 25b, which can be fabricated from copper, for example, and which is arranged between the magnetically free layer and the reference layer. The layer stack 700c thus furthermore comprises, following on from the further [Co/Pt]$_N$ metal multilayer 707, a CoFe layer 20 (the reference layer), a copper layer 25b (the nonmagnetic layer), a CoFe layer 30 (the magnetically free layer), a [Co/Pt]$_N$ metal multilayer 40, which is coupled to the CoFe layer 30, a platinum layer 721, a tantalum layer 722 and a ruthenium layer 723. Alternatively, a ruthenium layer can be inserted between the further [Co/Pt]$_N$ metal multilayer 707 and the CoFe layer 20 (the reference layer), the ruthenium layer providing for an antiferromagnetic coupling. The layer stack 700d comprises, instead of the CoFe layer 30 and the coupled [Co/Pt]$_N$ metal multilayer 40, a [CoFe/Pt]$_N$ metal multilayer 30, which constitutes the magnetically free layer.

Figure 8:
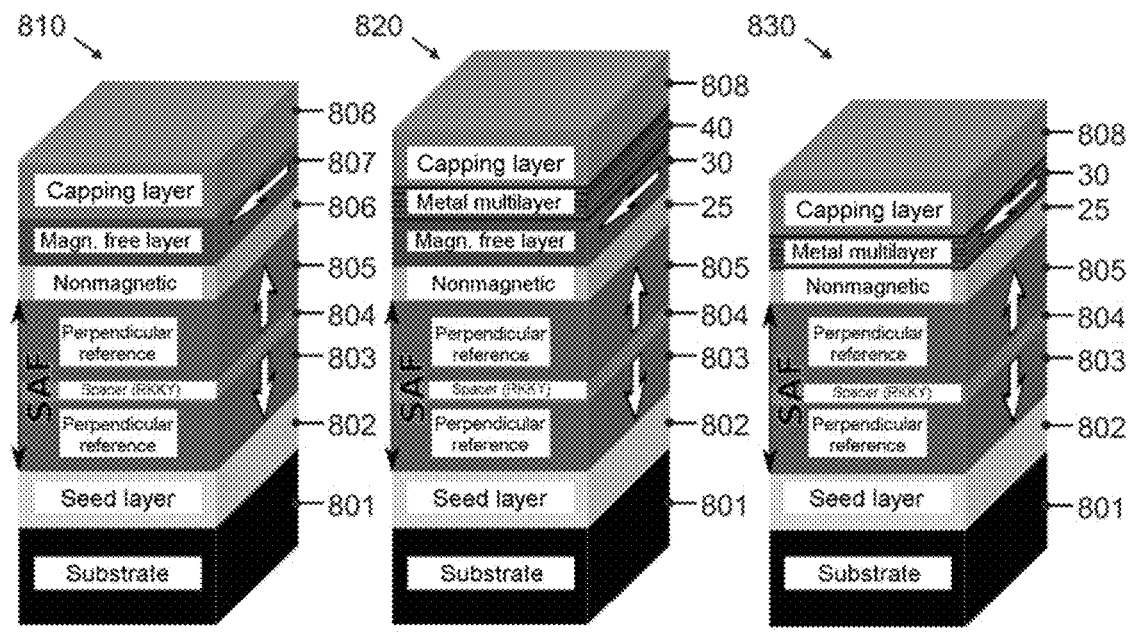
FIG. 8 shows a schematic diagram of layer stacks having an out-of-plane reference layer.

FIG. 8 shows the use of the concept in cross-geometric xMR sensors having an out-of-plane reference layer (see also FIG. 2b, for instance). FIG. 8 layer stack 810 shows a layer stack having a simple magnetically free layer 807, layer stack 820 shows a layer stack having a magnetically free layer 30 coupled to a metal multilayer 40, and reference sign 830 shows a layer stack having a metal multilayer 30 that constitutes the magnetically free layer 30. The three layer stacks 810, 820 and 830 have in common (from bottom to top) a substrate layer 801, a seed layer 802, a reference layer 803 having perpendicular anisotropy, a spacer layer 804, a further reference layer 805 having perpendicular anisotropy, a nonmagnetic layer 806; 25 and a capping layer 808. The layers 803, 804 and 805 form a synthetic antiferromagnet (SAF). The magnetically free layers 807; 30 (and the metal multilayer 40) are arranged between the nonmagnetic layer 806; 25 and the capping layer 808.

In layer stack 820 the metal multilayer 40 is designed such that it has a net out-of-plane anisotropy, but is coupled to the more dominant magnetically free layer 30 having an in-plane anisotropy, such that the anisotropy together is still in-plane. In layer stack 830 the metal multilayer is designed such that it has a net in-plane anisotropy. This is achieved primarily by choosing the correct layer thicknesses. In both cases, the magnetization saturation occurs at lower fields than for the layer stack 810.

Figure 9:
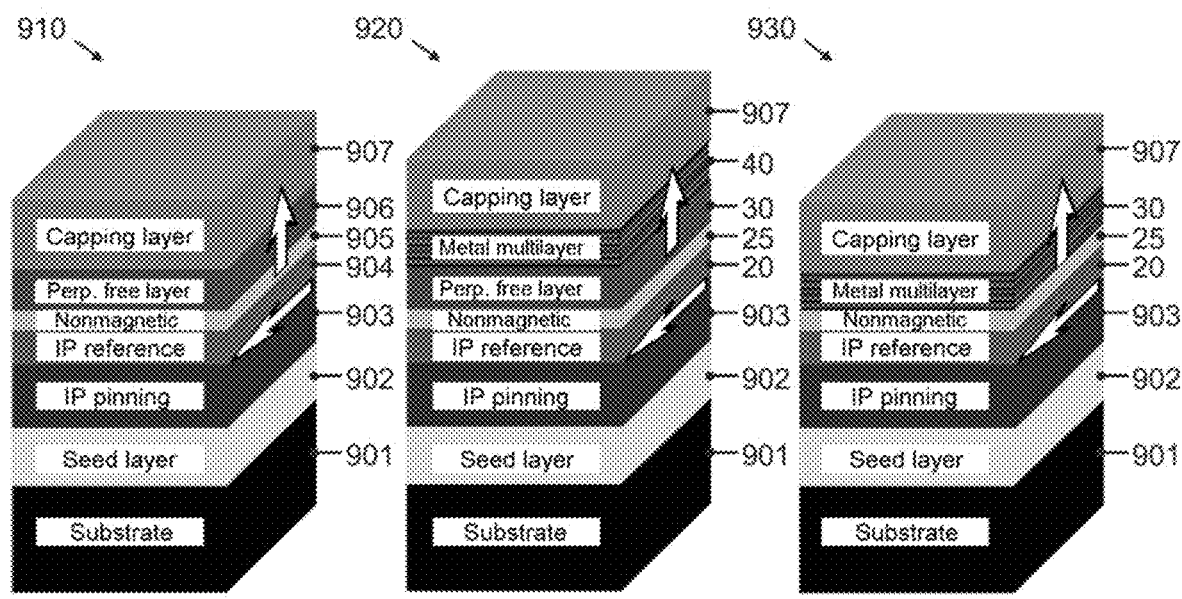
FIG. 9 shows a schematic diagram of layer stacks having an in-plane reference layer.

FIG. 9 shows the use of the concept in cross-geometric xMR sensors having an in-plane reference layer (see also FIG. 2a, for instance). FIG. 9 reference sign 910 shows a layer stack having a simple magnetically free layer 906, reference sign 920 shows a layer stack having a magnetically free layer 30 coupled to a metal multilayer 40, and reference sign 930 shows a layer stack having a metal multilayer 30 that constitutes the magnetically free layer 30. The three layer stacks 91, 920 and 930 have in common (from bottom to top) a substrate layer 901, a seed layer 902, an in-plane (IP) pinning layer 903, an IP reference layer 904/40, a nonmagnetic layer 905; 25 and a capping layer 907. The magnetically free layers 906; 30 (and the metal multilayer 40) are arranged between the nonmagnetic layer 905; 25 and the capping layer 907.

While in the case of TMR magnetic field sensors having MgO/CoFeB layers it is possible to achieve a perpendicular anisotropy without metal multilayers, the use of metal multilayer enables more degrees of freedom in the adaptation of the free layer. The CoFeB thickness can be chosen to be thicker, while at the same time a perpendicular anisotropy is maintained, if it is coupled to a metal multilayer.

The essence of at least some example implementations of the present disclosure is the use of a metal multilayer in the magnetically free layer in order to achieve optimized saturation fields in z-sensitive cross-geometric xMR sensors.

Figure 10A:
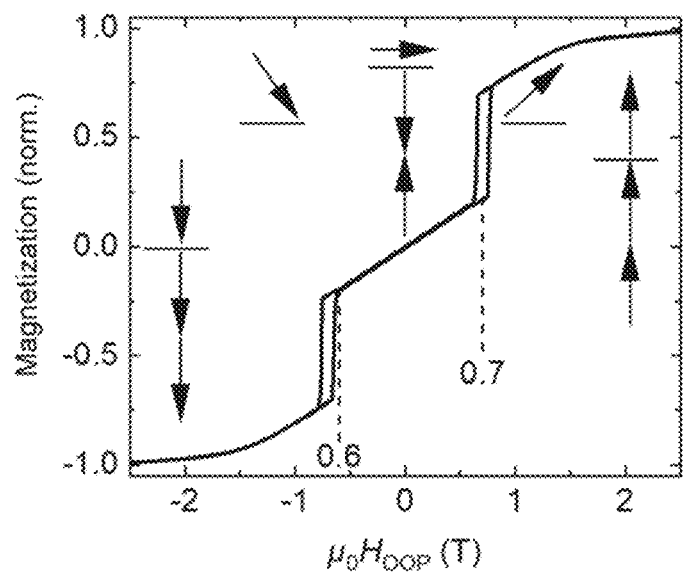
FIGS. 10a to 10e show diagrams of an evaluation of example implementations.
Figure 10B:
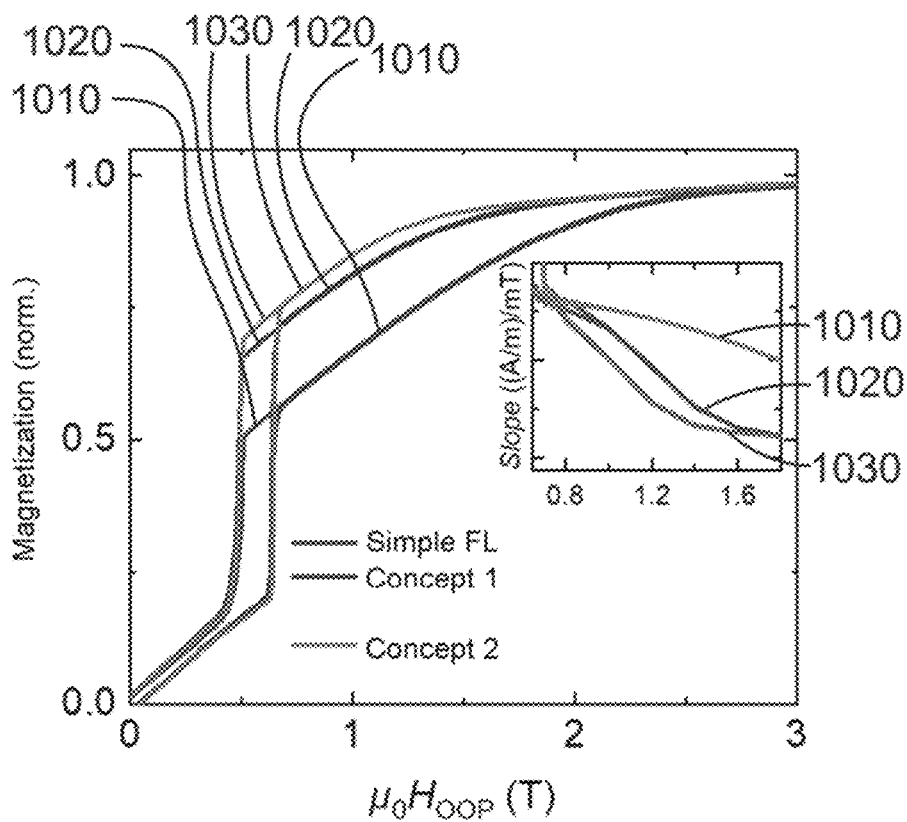
Figure 10C:
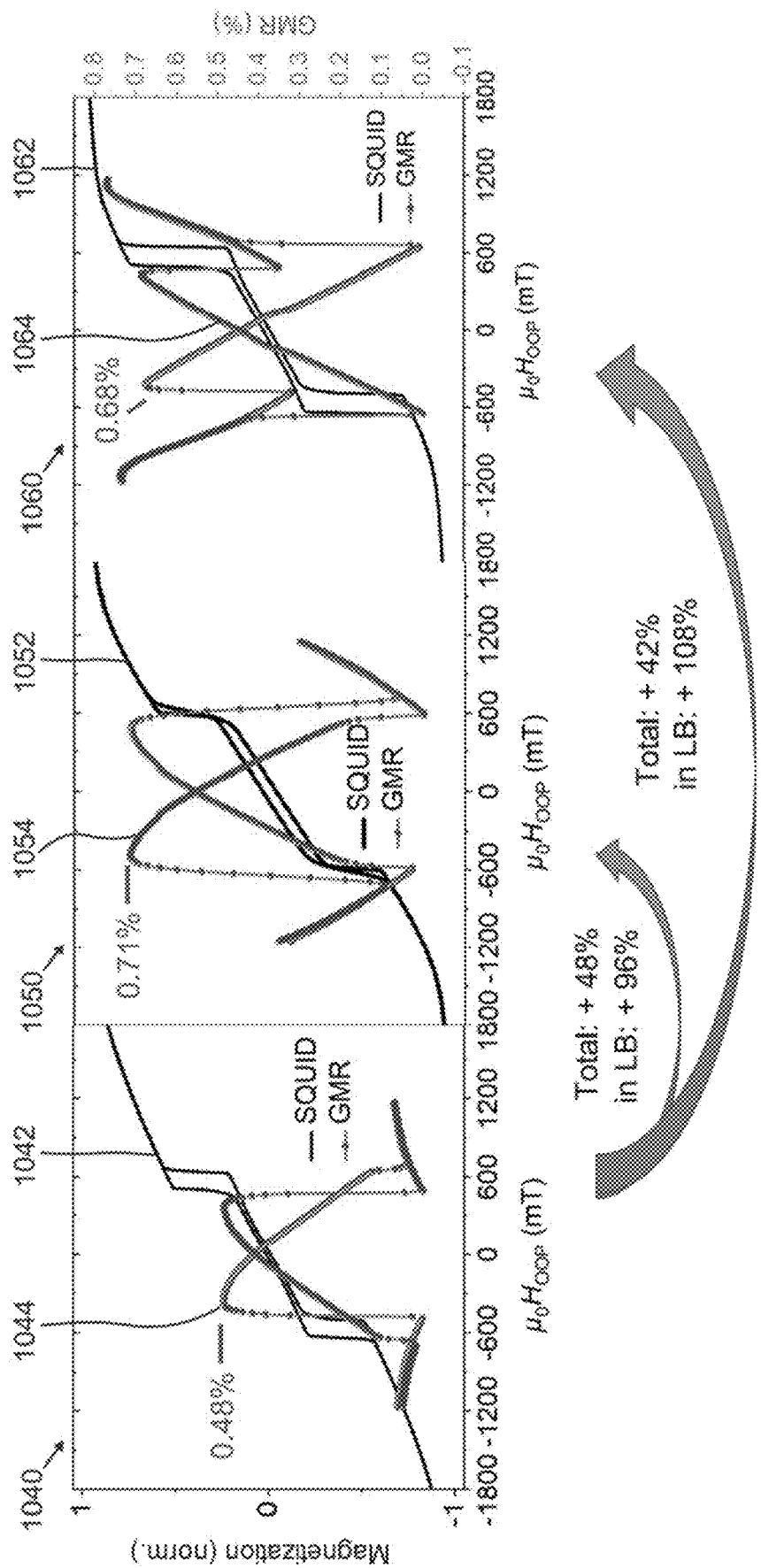

Initial measurements of these concepts had already been successful for GMR sensors. FIGS. 10a to 10c show various magnetization measurements. In each case the strength of the external magnetic field $\mu_0 H_{OOP}$ is plotted on the x-axis, and the normalized magnetization is plotted on the (left) y-axis. FIG. 10b shows magnetization measurements from a SQUID set-up having 3 cross-geometric GMR sensors, wherein the graphs 1010 show a GMR system having a simple magnetically free layer, the graphs 1020 show a GMR system having a magnetically free layer coupled to a metal multilayer (concept 1), and the graphs 1030 show a GMR system having a magnetically free layer fabricated from a metal multilayer (concept 2). The saturation of the free layer depends on the concept chosen for the magnetically free layer. The small illustration shows the derivative of the curves, as slope/gradient ((A/m)/mT). The p-SAF reference system saturates at below 0.8 T in all three sensors. Depending on the concept of the free layer, the magnetically free layer is saturated at approximately 2.5 T (conventional magnetically free layer 1010) or at approximately 1.5 T (1020 and 1030). For this measurement, the magnetically free layer coupled to a metal multilayer saturates at approximately 1.6 T, while the magnetically free layer fabricated from a metal multilayer saturates at approximately 1.4, e.g. at significantly lower fields than the conventional magnetically free layer. An electrical measurement of the GMR effect with the magnetically free layer fabricated from a metal multilayer even results in a saturation at approximately 1.2 T (see FIG. 10e) and simultaneously exhibits a very linear transfer curve. Further improvements should bring the magnetically free layer saturation even closer to the 500 mT linear range, see FIG. 11. The use of these concepts with highly sensitive TMR sensors can significantly increase the signal output.

FIG. 10c shows a diagram showing firstly the normalized magnetization of the concepts with a simple magnetically free layer (1040), in accordance with concept 1 (1050) and concept 2 (1060) (graphs 1042, 1052 and 1062), measured in accordance with SQUID, and also the GMR effect (graphs 1044, 1054 and 1064) (vis-à-vis the strength of the external magnetic field $\mu_0 H_{OOP}$). As can be seen in FIG. 10c, a usable GMR effect in the linear range (LB) can be doubled (concept 1: +96%, concept 2: +108%) or tripled (see FIG. 11b, left-hand side) by comparison with the concept having a simple magnetically free layer in the linear range.

Figure 10D:
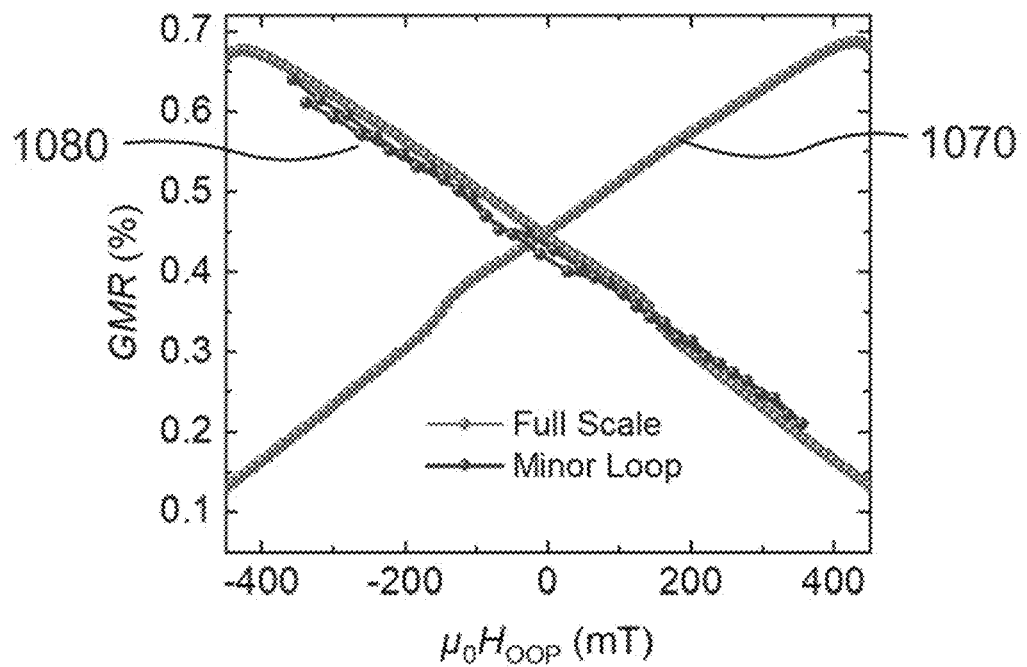

In this case, it is possible to achieve a high range of approximately 500 mT and also a sensitivity in the z-direction. Even TMR ratios of more than 50% appear to be possible. In this case, as is shown in FIG. 10d, a loss of linearity can be avoided. In FIG. 10d, the GMR effect (in %) is plotted against the strength of the external magnetic field $\mu_0 H_{OOP}$. In this case, graph 1070 designates the measurement for full scale and graph 1080 designates the measurement for the minor loop.

Figure 10E:
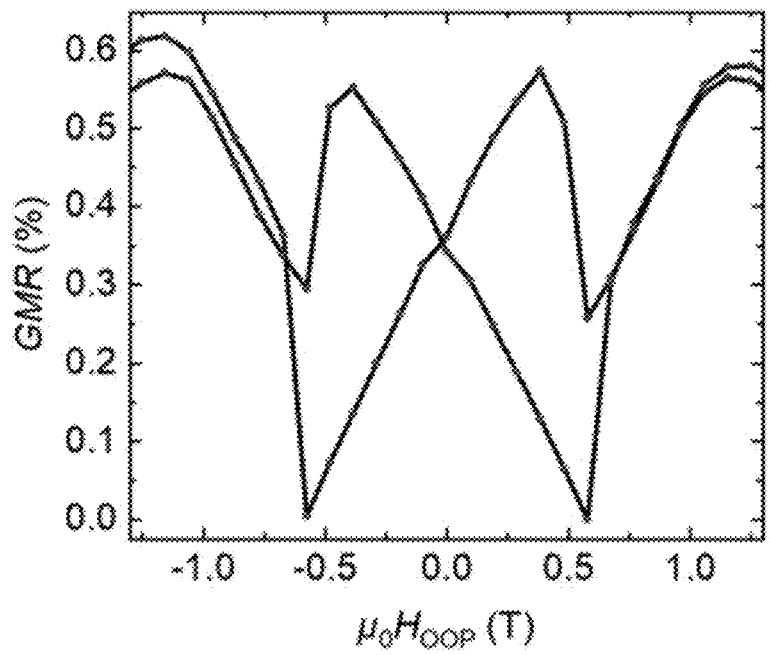

FIG. 10e shows a GMR transfer curve of a GMR sensor having a magnetically free layer fabricated from a metal multilayer. p-SAF saturation occurs at approximately 500 mT. The saturation of the free layer was able to be reduced to 1.2 T. Further improvements should be expected, see FIG. 11.

Figure 11A:
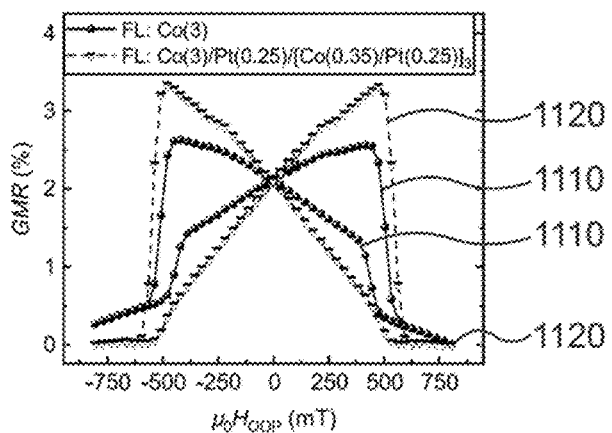
FIGS. 11a and 11b show diagrams of a GMR ratio under the influence of an external magnetic field for different implementations of a metal multilayer.
Figure 11B:
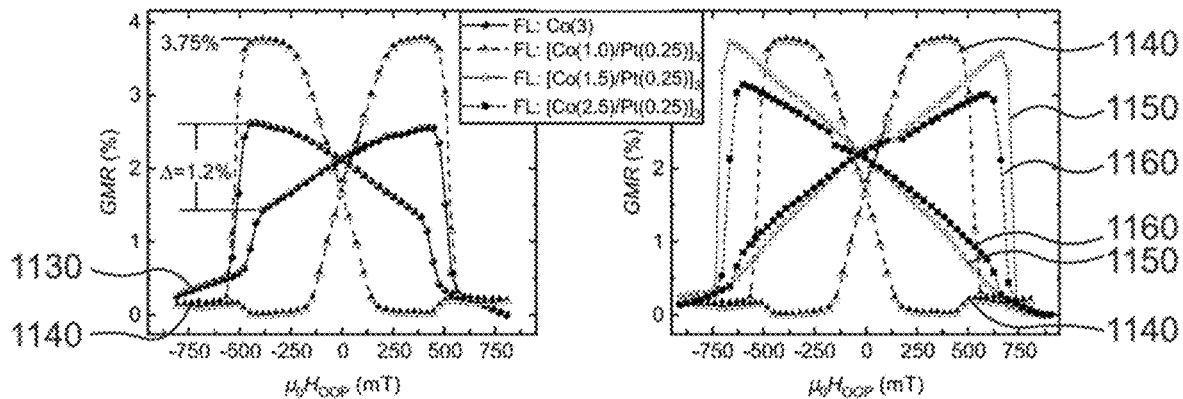

FIGS. 11a and 11b show diagrams of a GMR ratio under the influence of an external out-of-plane magnetic field for different implementations of the metal multilayer. In this case, FIGS. 11a and 11b show the influence on the GMR effect of a manipulation of the saturation of the magnetically free layer (FL), for the 1st concept in FIG. 11a (magnetically free layer+metal multilayer) and for the 2nd concept in FIG. 11b (metal multilayer constitutes the magnetically free layer). In this case, the graphs 1110 in FIG. 11a show the GMR ratio for a simple magnetically free layer having a thickness of 3 nm and the graphs 1120 show the GMR ratio for a magnetically free layer with a coupled metal multilayer having the values Co(3)/Pt(0.25)/[Co(0.35)/Pt(0.25)]3 (values in nm). In FIG. 11b, graph 1130 shows the GMR ratio for a simple magnetically free layer having a thickness of 3 nm, graph 1140 shows the GMR ratio for a metal multilayer having the values [Co(1.0)/Pt(0.25)]3, graph 1150 shows the GMR ratio for a metal multilayer having the values [Co(1.5)/Pt(0.25)]3 and graph 1160 shows the GMR ratio for a metal multilayer having the values [Co(2.5)/Pt(0.25)]3.

Example implementations of the present disclosure provide an approach which can generally be applied to all tasks of magnetic field detection (e.g. proximity detection, angle measurement, current measurement).

In example implementations, the sensor circuit 50 can correspond to an arbitrary controller or processor or a programmable hardware component. Arbitrary processors, such as digital signal processors (DSPs), can be used in this case. Example implementations here are not restricted to a specific type of processor.

Figure 12:
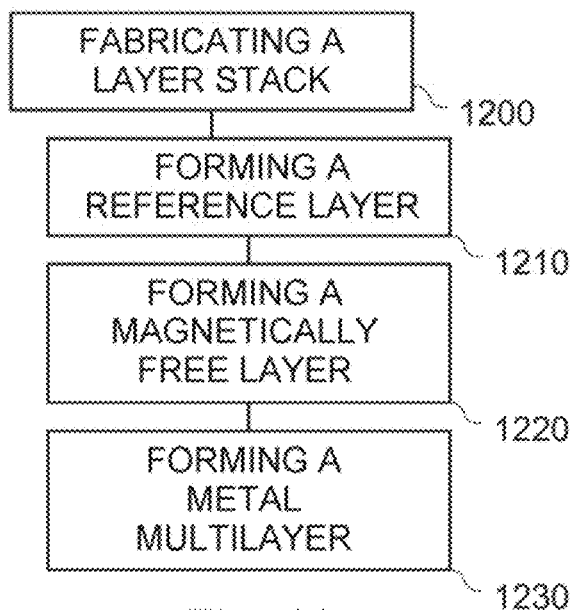
FIG. 12 shows a flow diagram of one example implementation of a fabrication method for a magnetoresistive sensor.

FIG. 12 shows a flow diagram of a fabrication method for a magnetoresistive sensor, for instance for the magnetoresistive sensors from FIGS. 5a to 9, for instance for the layer stacks of the magnetoresistive sensors. In this case, features of the corresponding magnetoresistive sensors or layer stacks can likewise constitute features of the method. The method comprises fabricating 1200 a layer stack of the magnetoresistive sensor. Fabricating the layer stack comprises forming 1210 a reference layer having a reference magnetization, which is fixed and has a first magnetic orientation. Fabricating the layer stack comprises forming 1220 a magnetically free layer. The magnetically free layer has a magnetically free magnetization, which is variable in the presence of an external magnetic field. The magnetically free layer has a second magnetic orientation in a ground state. One of the first or the second magnetic orientation is oriented in-plane and the other is oriented out-of-plane. Fabricating the layer stack comprises forming 1230 a metal multilayer. Either the metal multilayer is arranged adjacent to the magnetically free layer or the metal multilayer constitutes the magnetically free layer. Consequently, in the second case, forming 1230 the metal multilayer can correspond to forming 1220 the magnetically free layer.

In at least some example implementations, fabricating the layer stack can comprise forming one or more further layers, for instance a tunnel barrier layer, a nonmagnetic layer 25b, a seed layer, a pinning layer and/or a capping layer. In this case, the layer stack can be formed for example on a substrate, for instance on an Si substrate or an $SiO_2$ substrate. In this case, the order can depend on the order of the layers in the layer stack. In this regard, by way of example, it is possible firstly to form the seed layer on the substrate and gradually to build up the adjacent layers on the seed layer, for instance as illustrated in FIGS. 7a-d, 8 and/or 9. In this case, the individual layers can be formed by deposition.

The stack system described above can thus be integrated into an existing wafer process scheme. In a first step, the layer stack can be deposited (and thus fabricated) and then subdivided into separate junctions. Groups of junctions (nodes) can form a resistor that detects an external magnetic field in the z-direction. The electrical connection (to the sensor circuit 50) is effected for example via contacts from the top side and the underside or from the side (possible for GMR). A further implementation is a Wheatstone bridge configuration, e.g. for identifying field differences. In some example implementations, the fabrication method can furthermore comprise fabricating the sensor circuit 50.

More details and aspects of the method are mentioned in conjunction with the concept or examples described above (e.g. FIGS. 1a to 11b, in particular FIGS. 5a to 9). The method can comprise one or more additional optional features corresponding to one or more aspects of the proposed concept or of the described examples, as described above or below.

The aspects and features that have been described together with one or more of the examples and figures described in detail above can also be combined with one or more of the other examples in order to replace an identical feature of the other example or in order additionally to introduce the feature into the other example.

The description and drawings present only the principles of the disclosure. Furthermore, all examples mentioned here are intended to be used expressly only for illustrative purposes, in principle, in order to assist the reader in understanding the principles of the disclosure and the concepts contributed by the inventor(s) for further development of the art. All statements herein regarding principles, aspects and examples of the disclosure and also concrete examples thereof encompass the counterparts thereof.

It goes without saying that the disclosure of a plurality of steps, processes, operations or functions disclosed in the description or in the claims should not be interpreted as being in the specific order, unless this is explicitly or implicitly indicated otherwise, for example for technical reasons. The disclosure of a plurality of steps or functions therefore does not limit them to a specific order unless the steps or functions are not interchangeable for technical reasons. Furthermore, in some examples, an individual step, function, process or operation can include a plurality of partial steps, functions, processes or operations and/or be subdivided into them. Such partial steps can be included and be part of the disclosure of the individual step, provided that they are not explicitly excluded.

Furthermore, the claims that follow are hereby incorporated in the detailed description, where each claim can be representative of a separate example by itself. While each claim can be representative of a separate example by itself, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

What is claimed is:

1. A magnetoresistive sensor having a layer stack, the layer stack comprising:
    a reference layer having a reference magnetization, which is fixed and has a first magnetic orientation;
    a magnetically free layer,
        wherein the magnetically free layer has a magnetically free magnetization, which is variable in a presence of an external magnetic field, and which has a second magnetic orientation in a ground state,
        wherein one of the first magnetic orientation or the second magnetic orientation is oriented in-plane and another of the first magnetic orientation or the second magnetic orientation is oriented out-of-plane;
    a metal multilayer,
        wherein the metal multilayer is arranged adjacent to the magnetically free layer, or
        wherein the metal multilayer constitutes the magnetically free layer and a sensor circuit that comprises one or more sensor elements,
        wherein the one or more sensor elements are configured to detect one or more direction components of the external magnetic field across the layer stack to generate one or more voltages corresponding to the one or more direction components of the external magnetic field,
        wherein a first direction component of the one or more direction components is oriented parallel to the first magnetic orientation, and
        wherein a second direction component of the one or more direction components is oriented parallel to the second magnetic orientation.

2. The magnetoresistive sensor as claimed in claim 1, wherein the metal multilayer is arranged adjacent to the magnetically free layer, wherein the magnetically free layer is arranged between the metal multilayer and the reference layer.

3. The magnetoresistive sensor as claimed in claim 1, wherein the metal multilayer comprises a plurality of metal layers.

4. The magnetoresistive sensor as claimed in claim 1, wherein the first magnetic orientation is oriented out-of-plane, and wherein the second magnetic orientation is oriented in-plane.

5. The magnetoresistive sensor as claimed in claim 1, wherein the first magnetic orientation is oriented in-plane, and wherein the second magnetic orientation is oriented out-of-plane.

6. The magnetoresistive sensor as claimed in claim 1, wherein the reference layer is a cobalt layer, a cobalt-iron layer or a cobalt-iron-boron layer.

7. The magnetoresistive sensor as claimed in claim 1, wherein the magnetoresistive sensor has a first sensor plane and a second sensor plane, in which the magnetoresistive sensor is sensitive vis-à-vis the external magnetic field,
    wherein the first sensor plane is oriented parallel to a largest lateral extent of the reference layer, and
    wherein the second sensor plane is oriented perpendicular to the largest lateral extent of the reference layer.

8. The magnetoresistive sensor as claimed in claim 1, further comprising a tunnel barrier layer arranged between the magnetically free layer and the reference layer,
    wherein the magnetoresistive sensor is based on a tunnel magnetoresistance (TMR) effect.

9. The magnetoresistive sensor as claimed in claim 1, further comprising a nonmagnetic layer arranged between the magnetically free layer and the reference layer,
    wherein the magnetoresistive sensor is based on a giant magnetoresistance (GMR) effect.

10. The magnetoresistive sensor as claimed in claim 1, wherein the metal multilayer comprises a first plurality of layers of a first metal or of a first metal alloy and a second plurality of layers of a second metal, wherein layers of the first plurality of layers and the second plurality of layers are arranged alternately in the metal multilayer.

11. The magnetoresistive sensor as claimed in claim 10, wherein the first plurality of layers comprise cobalt and the second plurality of layers comprise one of platinum, palladium, gold, nickel and copper.

12. The magnetoresistive sensor as claimed in claim 10, wherein the first plurality of layers comprise iron and the second plurality of layers comprise one of platinum, palladium, gold, copper and silver.

13. The magnetoresistive sensor as claimed in claim 10, wherein the metal multilayer constitutes the magnetically free layer, and
    wherein the first plurality of layers is fabricated from a cobalt-iron alloy or a cobalt-iron-boron alloy.

14. A fabrication method for a magnetoresistive sensor, the method comprising:
    fabricating a layer stack of the magnetoresistive sensor by:
        forming a reference layer having a reference magnetization, which is fixed and has a first magnetic orientation;
        forming a magnetically free layer,
            wherein the magnetically free layer has a magnetically free magnetization, which is variable in a presence of an external magnetic field, and which has a second magnetic orientation in a ground state,
            wherein one of the first magnetic orientation or the second magnetic orientation is oriented in-plane and another of the first magnetic orientation or the second magnetic orientation is oriented out-of-plane;
        forming a metal multilayer, wherein the metal multilayer is arranged adjacent to the magnetically free layer, or wherein the metal multilayer constitutes the magnetically free layer; and forming a sensor circuit that comprises one or more sensor elements, wherein the one or more sensor elements are configured to detect one or more direction components of the external magnetic field across the layer stack to generate one or more voltages corresponding to the one or more direction components of the external magnetic field, wherein a first direction component of the one or more direction components is oriented parallel to the first magnetic orientation, and wherein a second direction component of the one or more direction components is oriented parallel to the second magnetic orientation.

15. The fabrication method as claimed in claim 14, wherein the metal multilayer comprises a plurality of metal layers.

16. The fabrication method as claimed in claim 14, wherein the first magnetic orientation is oriented out-of-plane, and wherein the second magnetic orientation is oriented in-plane.

17. The fabrication method as claimed in claim 14, wherein the metal multilayer comprises a first plurality of layers of a first metal or of a first metal alloy and a second plurality of layers of a second metal, wherein layers of the first plurality of layers and the second plurality of layers are arranged alternately in the metal multilayer.

18. The fabrication method as claimed in claim 14, wherein the metal multilayer comprises a first plurality of layers, of a first metal or of a first metal alloy, and a second plurality of layers of a second metal, wherein layers of the first plurality of layers and the second plurality of layers are arranged alternately in the metal multilayer.

* * * * *